United States Patent

Mancini

[15] 3,699,476

[45] Oct. 17, 1972

[54] CRYSTAL CONTROLLED DIGITAL LOGIC GATE OSCILLATOR

[72] Inventor: Ronald Alfred Mancini, Palm Beach Gardens, Fla.

[73] Assignee: RCA Corporation

[22] Filed: March 5, 1971

[21] Appl. No.: 121,307

[52] U.S. Cl.............331/116 R, 331/108 D, 331/158

[51] Int. Cl...............................................H03b 5/36

[58] Field of Search...............331/108 D, 116 R, 158

[56] References Cited

OTHER PUBLICATIONS

Baggett, " Low Frequency Sine Wave Crystal Oscillator," The Electronic Engineer, April 1970, pp. 88.

Cola, " Looking for a Universal Circuit," Electronic Design, February 1, 1967, pp. 48- 51.

Byers, Jr., " Power Your Oscillator with ECL," Electronic Design, August 1, 1968, pp. 70- 71.

*Primary Examiner*—Roy Lake
*Assistant Examiner*—Siegfried H. Grimm
*Attorney*—H. Christoffersen

[57] ABSTRACT

A high frequency crystal-controlled oscillator circuit which utilizes a digital logic gate in an amplifier mode of operation and produces sine or square wave output signals.

9 Claims, 1 Drawing Figure

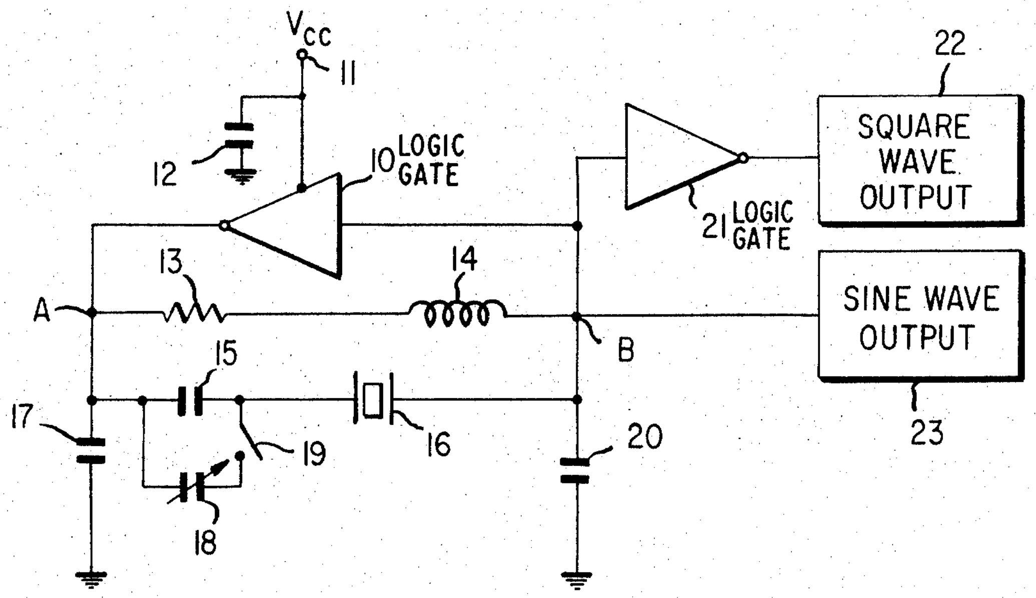
INVENTOR
RONALD ALFRED MANCINI
BY
J. Donald Weber, Jr.
ATTORNEY

CRYSTAL CONTROLLED DIGITAL LOGIC GATE OSCILLATOR

BACKGROUND AND CROSS REFERENCES

There are known in the art several circuits which utilize digital logic gates as a high frequency oscillator amplifier. However, the known circuits have one or more deficiencies in common. The deficiencies exhibited in the prior art circuits are, inter alia, distorted output sine wave, frequency instability, excessive crystal power dissipation, poor harmonic rejection, spurious oscillations, and/or the lack of adjustability. Typical oscillator circuits are shown in articles in "The Electronic Engineer," Sept. 1968, page 80 and "The Electronic Engineer," May 1969, page 91. In addition, a transistorized crystal oscillator circuit is shown and described in U.S. Pat. No. 3,311,848 to R.R. Freeland. The circuits shown in the above-cited references are illustrative of typical circuits known in the prior art.

The difficulties or deficiencies in the prior art networks are caused by a utilization of a series resonant crystal circuit or tank circuit which overdrives the logic element. In another problem area, the digital circuit is a.c. coupled whereby output signal distortion occurs.

In circuits embodying the instant invention, the listed deficiencies are overcome and eliminated. For example, the complex output signal is filtered by the crystal oscillator. In addition, digital noise on the output signal is eliminated as well. Ease of adjustability is readily provided. Appropriate circuitry is included to prevent excessive crystal power dissipation which, of course, eliminates the causes of instability and premature failure of the crystal circuit.

SUMMARY OF THE INVENTION

The invention is a crystal-controlled oscillator circuit. A digital logic gate is connected in an amplifier mode by means of a reactive impedance network in parallel therewith. A crystal network is connected in parallel with the logic gate as well. The output signal is taken from the input of the digital logic gate.

BRIEF DESCRIPTION OF THE DRAWING

In the single FIGURE there is shown a schematic diagram of one embodiment of the instant invention.

DESCRIPTION OF THE PREFERRED EMBODIMENTS

Referring to the single FIGURE, there is shown a crystal-controlled oscillator circuit. The oscillator circuit includes a digital logic gate 10 which is biased in the linear operating region thereof in order to be utilized as an amplifier circuit. Gate circuit 10 is any suitable circuit which may be used in this operation. A typical circuit is shown and described in the copending application of Charles F. Madrazo et al., Ser. No. 120,268, filed Mar. 2, 1971 and assigned to the assignee of the instant application.

Resistor 13, which is connected in the bias network of amplifier 10, is chosen to properly bias gate 10 in the linear operating region thereof. Inductor 14, which is connected in series with resistor 13, causes the bias path to be a high impedance path to AC signals. The bias path comprising resistor 13 and inductor 14 is connected between the input terminal (node B) and the output terminal (node A) of gate 10. The bias path allows logic gate 10 to be used as an amplifier and to be used with a crystal-$\pi$ feedback circuit described hereinafter without any adverse $d\Phi/df$ effects.

A suitable source $+V_{CC}$, represented by terminal 11, is connected to gate 10 to provide a supply voltage source therefor. Capacitor 12 is connected between terminal 11 and ground. Capacitor 12 may, in fact, be incorporated into the power source circuit or in the amplifier circuit. Capacitor 12 merely provides a shunt path wherein the full potential $V_{CC}$ cannot be instantaneously applied to amplifier 10. By using capacitor 12 (either internally or externally of amplifier 10) start-up operation of the oscillator circuit is assured.

Also connected between nodes A and B i.e., the output and input terminals of amplifier 10, respectively) is the crystal-$\pi$ network including crystal 16 and capacitor 15. Crystal 16 may be an anti-resonant crystal, e.g. a quartz crystal. A series network comprising variable capacitor 18 and switch 19 is connected across capacitor 15. Thus, in an alternative embodiment, switch 19 can be closed connecting variable capacitor 18 in parallel with capacitor 15. Thus, the capacitance in series with crystal 16 can be varied whereby adjustability is provided. Moreover, by varying the capacitance, initial component tolerances can be effectively eliminated or "zeroed." Of course, this alternative arrangement can be omitted in certain fixed signal operations. The crystal-$\pi$ network eliminates harmonic oscillations since the attenuation of the network increases with frequency.

In addition, capacitor 17 is connected between node A and ground while capacitor 20 is connected between node B and ground. Capacitors 17 and 20 are provided to "swamp-out" the input capacitance and the output capacitance of amplifier 10. Thus, capacitors 17 and 20 provide greater frequency stability in the circuit. That is, the relatively unstable input and output capacitances of the amplifier circuit 10 are relatively ineffective in the circuit operation.

Also connected to node B (i.e., the input terminal of amplifier 10) is a sine wave output 23. Square wave output 22 is connected to the output terminal gate 21 which has the input thereof connected to node B. Gate 21 operates upon the sine wave input signal to produce a square wave output signal.

In operation, it is seen that the output of logic gate 10 (which acts as an amplifier) drives the input to the crystal-$\pi$ network. The crystal-$\pi$ network includes capacitors 15, 17 and 20 as well as crystal 16. In addition, in the alternative embodiment capacitor 18 and closed switch 19 would be included in the crystal-$\pi$ feedback network. Since the output of logic gate 10 drives the input to the crystal-$\pi$ feedback network, the saturation and cutoff effects which are typical of logic gate operation are filtered out of the signal produced by gate 10 and a pure sine wave is obtained at node B, i.e., the sine wave output 23. It should be noted that, if the output of the oscillator were taken form the logic gate output (i.e., node A) the output waveform would contain considerable distortion and would be dependent upon the specific operating characteristics of each individual logic gate.

However, the time constant of the network comprising resistor 13 and inductor 14 is relatively large. Therefore, not output oscillations can occur except those oscillations which occur through the crystal-π feedback network. If inductor 14 is omitted and only resistor 13 is included, small, spurious oscillations arising from operation of gate 10 and resistor 13 will occur. These spurious oscillations will appear as very high frequency sine waves superimposed upon the fundamental frequency sine wave output signal. Thus, for superior performance, it is extremely desirable to include a reactive impedance, such as inductor 14, in the bias path and to provide the output signal at the input terminal of amplifier 10.

Furthermore, the total capacitance for capacitors 17, 15 and 20 (and 18 if used) is properly chosen to comply with the specific loading capacitance for an anti-resonant crystal. An anti-resonant crystal, such as crystal 16, appears inductive and the inductance of the crystal limits the current therethrough as well as the power dissipation of the crystal. By properly choosing the capacitors relative to the crystal, the circuit will not suffer the problems of excessive overload and instability.

There is thus described, a crystal-controlled oscillator. The addition of an inductor in the bias circuit enables the coupling of a logic gate and a crystal-π feedback network. The combination of the logic gate (biased as an amplifier) and the crystal-π feedback network produces a superior crystal-controlled oscillator. By using a crystal with a specific frequency tolerance, the frequency tolerance of the circuit can be determined with, or without, adjustments (as, for example, by adjusting capacitor 18). This tolerance, of course, includes the effects of initial component tolerances, crystal tolerances, aging, temperature and wiring. Moreover, the output signal of the oscillator is a pure sine wave. Since the sine wave is referenced to the DC threshold of a logic gate, the sine wave can be used to drive similar logic elements. Thus, logic systems can be defined for use with this circuit.

The circuit described herein is a preferred embodiment of the invention. Any modifications to this circuit which fall within the purview of the invention, as described, are intended to be included in the appended claims. Specific references to component types or values are illustrative only and not intended to be limitative.

What is claimed is:

1. A signal generator comprising amplifier means having an input terminal and an output terminal, bias means connected across said amplifier means from said input terminal to said output terminal, capacitor means and crystal means arranged in a crystal-π network connected across said amplifier means from said input terminal to said output terminal, said crystal-π network exhibiting attenuation which increases with frequency whereby harmonic oscillation is decreased, and output means connected to said input terminal of said amplifier means.

2. The signal generator recited in claim 1 wherein said amplifier means includes digital logic circuit means, and said bias means includes resistive and reactive impedance means to bias said digital logic circuit means into the linear amplifier operating mode.

3. The signal generator recited in claim 1 wherein said crystal-π network includes variable capacitance means.

4. The signal generator recited in claim 1 including second amplifier means having an input terminal and an output terminal, said input terminal of said second amplifier means connected to said input terminal of said first amplifier means, and second output means connected to said output terminal of said second amplifier means.

5. The signal generator recited in claim 1 including source means connected to said amplifier means to effect operation thereof and to assure oscillation of said signal generator.

6. The signal generator recited in claim 4 wherein said first-mentioned output means produces a sine wave output signal, and said second output means produces a square wave output signal.

7. The signal generator recited in claim 1 wherein said capacitor means includes capacitive means connected to said input and output terminals of said amplifier means to overcome the effect of inherent capacitance values at said input and output terminals.

8. A signal generator comprising amplifier means having an input terminal and an output terminal crystal network means connected across said amplifier means from said input terminal to said output terminal, bias means comprising a resistor serially connected to an inductor and connected across said amplifier means from said input terminal to said output terminal, said inductor in said bias means being selected to attenuate AC signals in said bias means and reject high frequency oscillations imposed upon the fundamental output frequency of said signal generator, and output means connected to said input terminal of said amplifier means.

9. The signal generator recited in claim 8 wherein said amplifier means includes digital logic circuit means, and said resistor within said bias means is selected to bias said digital logic circuit means into the linear amplifier operating mode.

* * * * *